United States Patent
Shah

(10) Patent No.: US 9,284,182 B1
(45) Date of Patent: Mar. 15, 2016

(54) MEMS DEVICES ANTI-STICTION COATING AND ENCAPSULANT HAVING OPPOSING WATER RESITIVE CHARACTERISTICS

(71) Applicant: Ashish A. Shah, Lincoln, MA (US)

(72) Inventor: Ashish A. Shah, Lincoln, MA (US)

(73) Assignee: QUALTRE, INC., Marlborough, MA (US)

( * ) Notice: Subject to any disclaimer, the term of this patent is extended or adjusted under 35 U.S.C. 154(b) by 26 days.

(21) Appl. No.: 13/971,088

(22) Filed: Aug. 20, 2013

(51) Int. Cl.
   *B81B 3/00* (2006.01)
   *B81C 1/00* (2006.01)

(52) U.S. Cl.
   CPC .............. *B81B 3/0018* (2013.01); *B81B 3/0005* (2013.01); *B81B 3/0035* (2013.01); *B81B 3/0072* (2013.01); *B81C 1/0019* (2013.01); *B81C 1/00182* (2013.01); *B81C 1/00277* (2013.01)

(58) Field of Classification Search
   CPC ............ B81C 1/00285; B81C 1/00952; B81C 1/00182; B81C 1/0019; B81C 1/00277; B81B 3/0021; H01L 2924/1461
   USPC ........................................................ 257/415
   See application file for complete search history.

(56) References Cited

U.S. PATENT DOCUMENTS

| 8,816,492 B1 * | 8/2014 | Minervini ..................... 257/701 |
| 2009/0174148 A1 * | 7/2009 | Bischof et al. ................ 277/316 |

\* cited by examiner

*Primary Examiner* — Anh Mai
(74) *Attorney, Agent, or Firm* — Burns Levinson LLP; Bruce D. Jobse

(57) ABSTRACT

Disclosed is an isolation mechanism and technique for packaging a MEMS transducer, such as a bulk acoustic wave gyroscope or accelerometer, to provide isolation from externally applied (or internally induced) stress, strain, vibration, shock and thermal transients. The disclosed methods and techniques enable the location of voids/air cavity/environmental isolations inside an encapsulant or over mold compound to be custom selected by treating at least a portion of the exterior surfaces of the MEMS device package with anti-stiction coatings to create opposing hydrophobic and hydrophilic conditions which during encapsulant and transfer molding steps create voids or air bubbles in the proximity of the anti-stiction coating due to the opposing water resistive characteristic of encapsulant.

12 Claims, 3 Drawing Sheets

MEMS DEVICES ANTI-STICTION COATING AND ENCAPSULANT HAVING OPPOSING WATER RESITIVE CHARACTERISTICS

FIELD OF THE INVENTION

The disclosure relates to Microelectromechanical Systems (MEMS) devices, and, more specifically, to an apparatus and technique for isolating MEMS devices from external and internal stimuli.

BACKGROUND OF THE DISCLOSURE

Microelectromechanical Systems (MEMS) devices are typically attached to a housing structure, and the housing structure attached to another entity, such as a circuit board. External forces transmitted from the housing structure to the MEMS device may detrimentally affect the performance of the MEMS sensor or transducer located within the MEMS device. For example, if the sensor 30 comprises a bulk acoustic wave resonator having a disc shaped resonator element, such as disclosed in United States Patent Application Publication 2012/0227,487, the transducer may be supported at the disc center by an anchor. For other devices utilizing a capacitive resonator element, such as those disclosed in U.S. Pat. No. 7,023,065, an anchor may still support the transducer symmetrically so as not to bias the performance of the transducer due to its location.

While certain prior publications address how to protect MEMS devices with sensing gaps on the order of micrometers, they have not disclosed how to protect MEMS devices wherein the sensing gaps are on the order of nanometers. The susceptibility to interfering stimuli for devices based on nanometer distances for the sense gaps is perhaps 100 to 1000 times greater than those based on micrometer distances.

Devices with nanometer sized gaps are ~100-1000 times more susceptible to induced strains caused by stresses, vibrations, thermal fluctuations than those with micrometer sized gaps. This is due to the fact that the minute fluctuations in gap distance caused by the stresses, vibrations and thermal transients are much larger fraction of the gap on a nanometer gapped device than a micrometer gapped device. This stems from the physics of how capacitance is defined. The change in gap causes a change in capacitance which causes a change in the output signal. When this gap distance is affected by stimuli other than the desired signal source, it is perceived as "noise" and is consequently undesirable.

There have been many disclosures relating to MEMS gyroscopes being fabricated on silicon die. While these disclosures have generally disclosed how to protect MEMS devices wherein the sensing gaps are on the order of micrometers; they have not disclosed how to protect MEMS devices wherein the sensing gaps are on the order of nanometers. The susceptibility to interfering stimuli for devices based on nanometer distances for the sense gaps is perhaps 100 to 1000 times greater than those based on micrometer distances. Some practices, in the past have involved using compliant adhesives, flexible substrates and mechanical flexures to address the issue of susceptibility. Devices with Nanometer sized gaps are ~100-1000 times more susceptible to induced strains caused by stresses, vibrations, thermal fluctuations than those with micrometer sized gaps. This is due to the fact that the minute fluctuations in gap distance caused by the stresses, vibrations and thermal transients are much larger fraction of the gap on a nanometer gapped device than a micrometer gapped device. This stems from the physics of how capacitance is defined. The change in gap causes a change in capacitance which causes a change in the output signal. When this gap distance is affected by stimuli other than the desired signal source, it is perceived as "noise" and is consequently undesirable.

Accordingly, a need exists for a mechanism that isolates the transducer within a MEMS device from both internal and external stimuli.

SUMMARY OF THE DISCLOSURE

Disclosed is an isolation mechanism and technique for packaging a MEMS devices, such as a bulk acoustic wave gyroscope or accelerometer which allows rotational information to be sensed by the sensor while providing the necessary isolation from externally applied (or internally induced) stress, strain, vibration, shock and thermal transients. The MEMS device may comprise a housing substrate, one or more transducers, one or more integrated circuits, and an isolation mechanism constructed of interposing materials that permit mechanical, thermal and vibrational isolation of the transducer from the substrate, while still permitting electrical continuity between the MEMS device and the external environment. The interposing materials provide isolation from interfering stimuli, and, in conjunction with their physical proximity to the transducer and a substrate within an aperture/cavity of the MEMS device housing, effectively decrease the mechanical coupling between the transducer, the substrate and subsequent stimuli from both the external and internal environment, all while still permitting electrical continuity to be maintained between the transducer and substrate. The advantages of the disclosed system and techniques over the existing art is an increased isolation from both external stimuli as well as internally generated stimuli that are not desirable and thus considered noise.

Typically, MEMS gyroscope packaging uses a conventional overmolded plastic package approach, sometimes with a ceramic substrate or sometimes with a circuit board type substrate. No special attention is paid to the distribution or focusing of forces (either mechanically or thermally induced). The disclosed technique specifically "shields" these environmental forces by focusing or distributing them accordingly in order to maximize immunity of the MEMS sensor to the externally applied forces due to the environment (thermal, stress) or customer application/treatment.

More specifically, disclosed are various methods and techniques to customize the location of voids/air cavity/environmental isolations inside an encapsulant or over mold compound. According to the disclosed technique, at least a portion of the surfaces of the MEMS device package are treated with anti-stiction coatings to create opposing hydrophobic and hydrophilic conditions which during encapsulant and transfer molding steps generate air cavity(s) due to the tendency of nonpolar substances to aggregate in aqueous solution and exclude water molecules. These methods involve the addition or deposition of these environmentally decoupling structures (temperature insulating elements) in strategic places along any of the edges, faces and corners of a MEMS sensor via a resist or a soft mask. Next, the addition of material/encapsulant/mold, which by virtue of the annealing process, applies a compressive stress to all objects encased in it (MEMS plus environmental de-coupler). By doing this, MEMS device package may be shielded by the change in the compressive forces due to change in modulus of elasticity of encapsulant/mold due to exposure to temperature and other environmental conditions during manufacturing and operation. By Attenuating or at least causing them to be constant makes MEMS performance predictable overall operating condition and thus amenable to electronic controls (Electronic compensation via ASIC).

According to one aspect of the disclosure, a microelectromechanical (MEMS) apparatus comprises: a MEMS transducer having plurality of exterior surfaces; and an isolation layer surrounding at least one of the plurality of exterior surfaces and encompassing at least one cavity formed within the isolation layer and adjacent a portion of one of the plurality of exterior surfaces. In one embodiment, the apparatus further comprises an anti-stiction coating on at least the portion of one of the plurality of exterior surfaces.

According to another aspect of the disclosure, a method of manufacturing a microelectromechanical (MEMS) device comprises: A) providing a MEMS transducer having a plurality of exterior surfaces; and B) applying an anti-stiction coating to at least a portion of one of the plurality of exterior surfaces; and C) applying an encapsulation material over the portion of one of the plurality of exterior surfaces to which the anti-stiction coating is applied, wherein one of the anti-stiction coating and the encapsulation material is hydrophobic and the other of the anti-stiction coating and encapsulation material is hydrophilic. In one embodiment, the coating is applied at multiple locations on one of the plurality of exterior surfaces. In another embodiment, the hydrophobic coating is applied multiple of the plurality of exterior surfaces.

According to yet another aspect of the disclosure, a microelectromechanical (MEMS) apparatus comprises: a MEMS transducer having plurality of exterior surfaces; an anti-stiction coating disposed on at least a portion of one of the plurality of exterior surfaces; and an isolation layer surrounding the one of the plurality of exterior surfaces; wherein one of the anti-stiction coating and the isolation layer is hydrophobic and the other of the anti-stiction coating and isolation layer is hydrophilic. In one embodiment the apparatus further comprises a cavity substantially surrounding the anti-stiction coating and formed in the isolation layer. In another embodiment, a plurality of anti-stiction coatings are disposed on a plurality of portions of the exterior surfaces and a plurality of cavities, each cavity substantially surrounding one of the plurality of anti-stiction coatings are formed in the isolation layer.

DESCRIPTION THE DRAWINGS

Embodiments of the disclosed subject matter are described in detail below with reference to the following drawings in which.

Figure 3A:
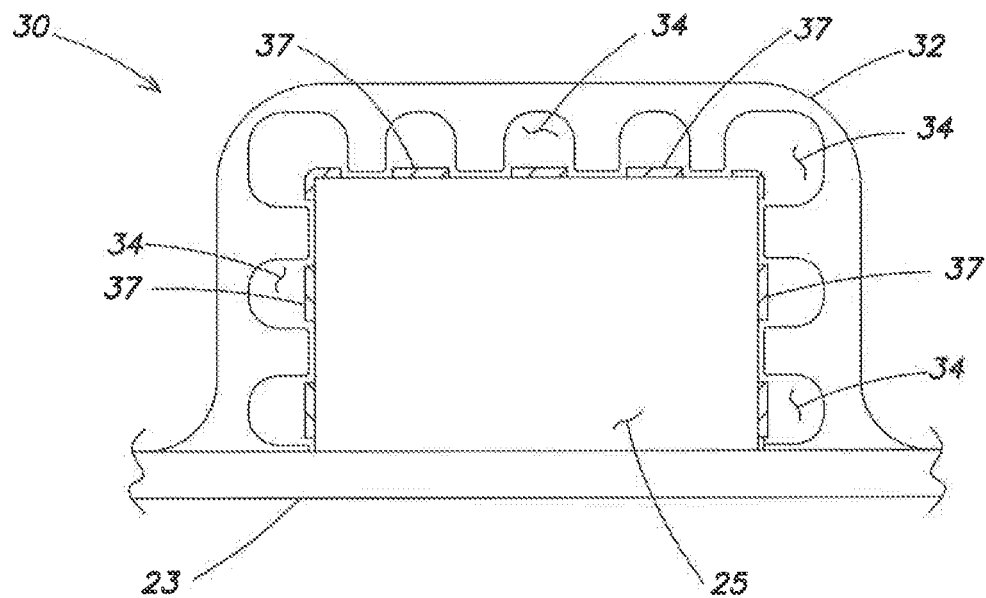
Figure 3B:
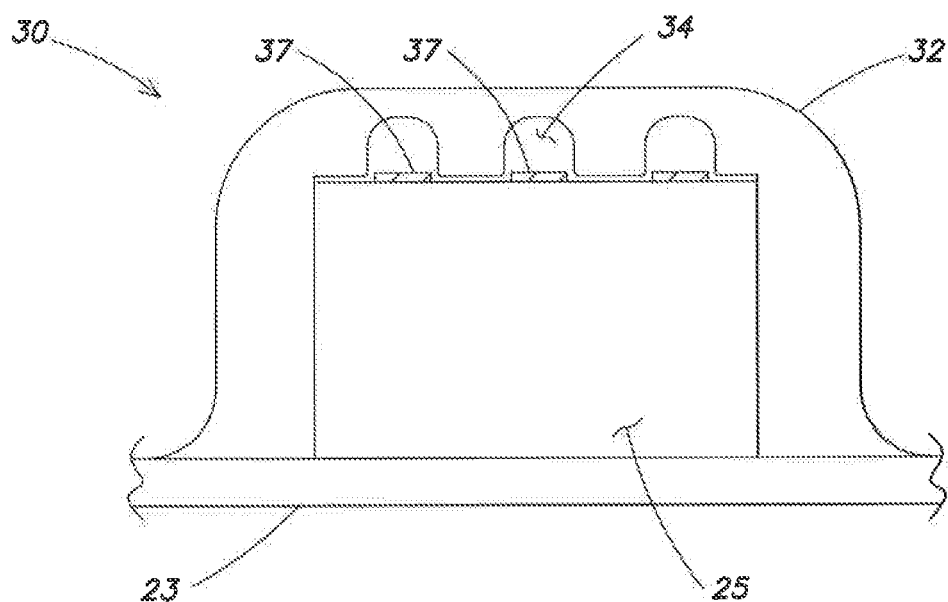
Figure 4:
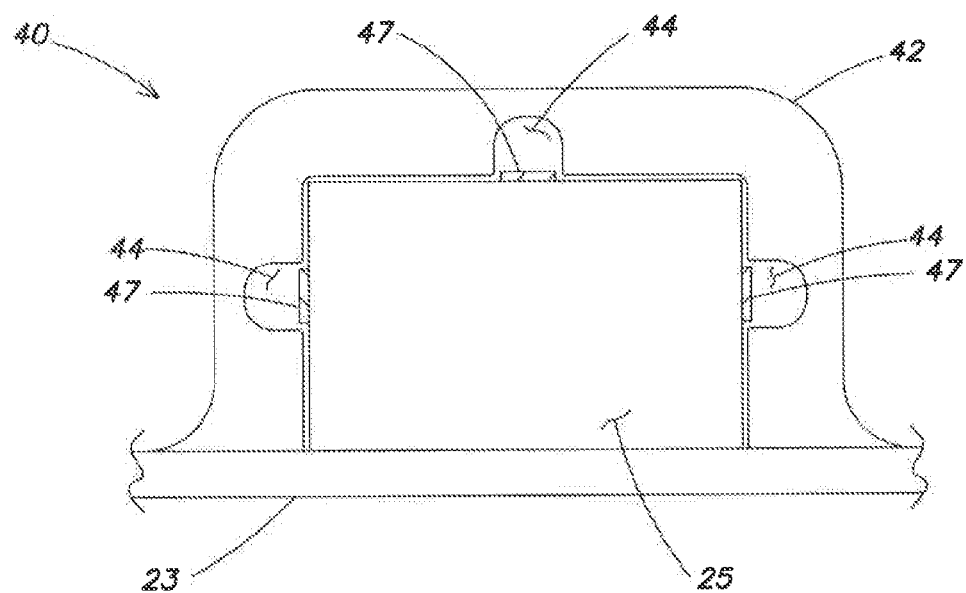
Figure 5:
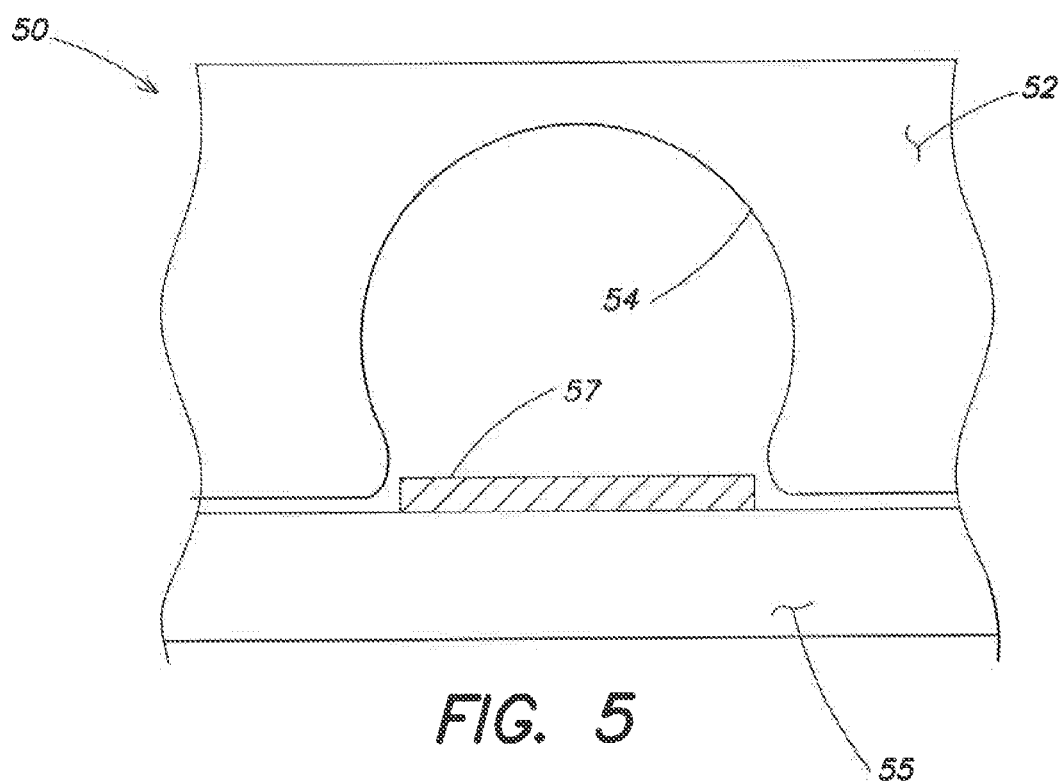

FIGS. 3A-B illustrate conceptually a partial cross-sectional views of a MEMS device in accordance the present disclosure;

FIG. 4 illustrates conceptually a partial cross-sectional view of a MEMS device in accordance with the present disclosure; and FIG. 5 illustrates conceptually a partial cross-sectional view of a MEMS device in accordance with the present disclosure.

DETAILED DESCRIPTION

MEMS devices, in particular capacitive devices like gyroscopes, accelerometers, microphones, pressure sensors and combinations thereof, are susceptible to having their performance compromised by externally induced strains. This is due, in part, because there are typically very small air gaps, on the order of 100's of nanometers in BAW devices, and micrometers in other devices, that will change when then the structures defining them are moved with respect to each other. The external strains may be introduced by a number of methods. One for example is the thermal mismatch between the device and the board to which it is mounted and also the solder or adhesive used to achieve such attachment. Such mismatch results in a warpage of the MEMS package, and, hence, an induced strain in all bodies in the system. Another source of strain is that which is incurred during the assembly of the MEMS device. In this scenario, the MEMS sensor, and the surrounding housing/package, along with adhesives, have differing thermal expansion coefficients and as well as different Young's Moduli. Combining these objects together, using traditional assembly processes requiring heating steps, results in residual stresses in the composite structure which then results in strains in the bodies of that composite structure. If there is a MEMS sensor in the composite structure, it too will be subjected to these stresses and strains.

The isolation mechanism disclosed herein mitigates the stress and strain transfer to the MEMS sensor by virtue of the structure and material selection. By surrounding the MEMS sensor on all sides with a very low modulus material, the transmission of stress and strain to the sensor is mitigated. Additionally, the isolation mechanism provides an enclosure which is isotropic, in that there is no direction which is inherently more susceptible to externally applied stress and strain. This isotropic enclosure is more beneficial with regards to thermally induced stresses and strains as well as isolation from vibration.

Capacitive based, MEMS sensors with sense air gaps on the order of 100's of nanometers, may exhibit high sensitivity to vibrational and acoustic energy. These forms of energy may manifest in the form of noise that compromises the signal fidelity of the MEMS sensor. Additionally, MEMS sensors, whose operation involves the excitation of one member of the device by electrical actuation, also cause vibration will suffer the problem of preventing other portions of the sensor from also vibrating in phase with the member which is excited. When such a sensor is affixed to a substrate or other structure for the purpose of extracting useful operation, the vibrations are controlled so that signal integrity is not compromised, by suspending the MEMS sensor in a way that maximizes isolation of the vibrations, but still allow for robust electrical and mechanical connections to the package, housing or mounting structure.

Capacitive MEMS sensors using very small air gaps (~100 nanometers) may also be affected by small, rapid fluctuations in temperature on account of the small scale. Large, slow variations in temperature can typically be accommodated by electronic correction algorithms, however, smaller rapid fluctuations, akin to Brownian motion may result in an apparent noise signal, which tends to compromise the performance of a BAW type sensor. Coating or covering the sensor with a material, other than air, may attenuate the magnitude and hence effect of the thermal fluctuations at the critical structures of the MEMS sensor, however, without due care in material selection, the mechanical properties, e.g. Young's modulus and coefficient of thermal expansion may induce other strains in the sensor when absorbing the thermal energy. This may result in degradation of device performance similar to that described above whereby stresses, strains and vibrations manifest as noise in the system and thus degrade the Signal to noise (or fidelity) of the device.

External sources of vibration may cause degradation of the device function. Internal vibrations may also be a source of degradation and may also be mitigated through addition of elastomeric masses which are inherently non-linear and thus effectively dissipative with respect to vibrational energy. The vibration of the disc in a bulk acoustic wave MEMS device is complicated by the fact that other structures in the sensor (i.e. electrodes, cap wafer, handle wafer) are also vibrating. In some cases, these structures vibrate in phase with and couple to the disc-shaped resonator resulting in a degradation of the overall sensor performance, with the vibrations manifest as noise and thus compromise the signal-to-noise ratio in the sensor output signal. To mitigate such effect masses, e.g. silicones, elastomers in general, attached to these other structures, e. g. electrodes, cap, and handle wafer, that are non-linear materials. The non-linear materials are known to be effective absorbers of vibrational energy and hence serve to attenuate such unwanted vibrations thereby approaching a more ideal situation where the disc appears to be vibrating in free space and has minimal coupling to any other structures. Quenching unwanted vibrations of the structures which are not the disc, effectively increases the sensitivity of the device which is manifest as an increase in signal to noise ratio (SNR).

Thermal fluctuations are another form of vibrational energy that also result in fluctuations in physical dimensions via the thermal expansion coefficients. By attaching additional elastomeric mass to the exterior of the MEMS sensor, the external thermal fluctuations are attenuated due to the elastomer's heat capacity. Furthermore, when the elastomer heats and cools, it expands and contracts, however, due to its very low elastic modulus (a typical property of an elastomer) and percent elongation, these expansions and contractions are not necessarily transferred to the sensor, which typically comprises silicon or ceramic. The modulus of silicon is many orders of magnitude higher than silicone. The result is that the elastomer provides for attenuation of thermal fluctuations while not impinging any significant stresses or strains to the sensor.

Airborne acoustic vibrations (i.e. sound) may also manifest at the transducer as noise on account of it having excited the exterior of the package or portions of its bulk that are adjacent to the exterior. To remedy this, one or more of the elastomeric materials, typical the outer-most portions may be constituted in such a way to act as an open-cell foam. This has the effect of attenuating acoustic energy impingement upon it resulting in an attenuation of vibrations that would be transmitted to and sensed by the transducer.

Currently, the state of the art in MEMS gyroscope packaging, does not recognize that the vibrating element (disc) of the MEMS transducer not only has to be isolated from the external environmental vibrations but also from the vibrations of the other elements of the MEMS transducer itself. In particular, the supporting portions (bulk of the silicon die) and the electrodes are not supposed to be vibrating in phase with the disc or at all. Moreover, the element referred to as the anchor, which is a very small diameter disc that physically connects the disc to the support element is a source of vibration coupling between the disc and the support. Additional coupling is achieved by virtue of attenuating and dissipating the vibrations of the support on account of the mass of non-linear material (silicone) attached to it. This increased mass and also energy dissipative material, serves to quench the vibrations in the support and as a result the vibrations of the disc can be more effectively sensed.

Figure 1:
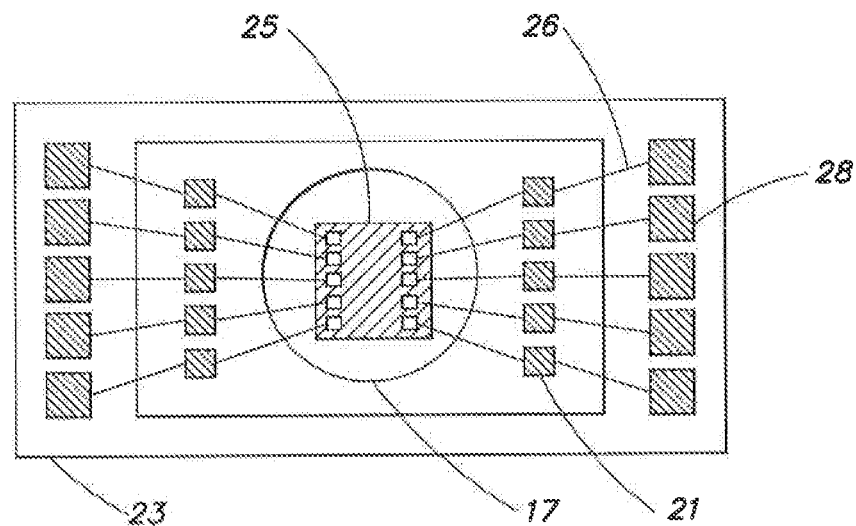
FIG. 1 illustrates conceptually a partial top view of a MEMS device in accordance with the present disclosure.

FIG. 1 illustrate conceptually cross sectional side and top views of MEMS device package comprising a substrate 23, MEMS transducer 25, an aperture 17 disposed within the substrate 23, wirebond pads 21, solder pads 28, conduits 26 between wirebond pads 21 and solder pads 28 disposed on the surfaces of the substrate 23. In subsequent drawings, the aperture 17, wirebond pads 21, solder pads 28, conduits 26 are not shown for the sake of simplicity, however the reader will understand that such elements may also be implemented similar to the MEMS transducer 25 shown in FIG. 1.

Figure 2:
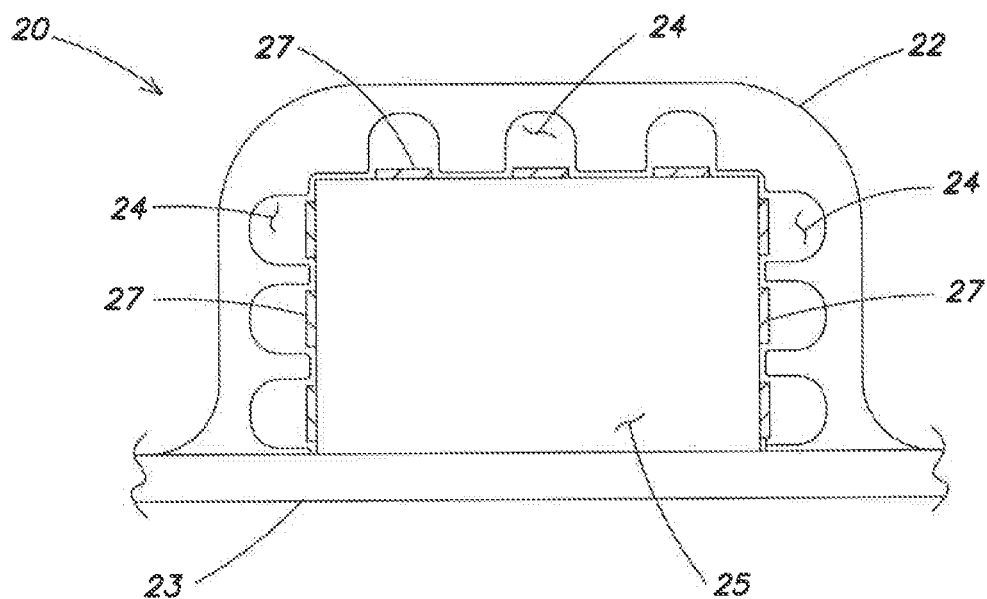
FIG. 2 illustrates conceptually a partial cross-sectional view of a MEMS device in accordance with the present disclosure.

FIG. 2 illustrates conceptually a partial cross-sectional view of a MEMS device 20 comprising a substrate 23, a MEMS transducer 25 and an anti-stiction coating 27 and an isolation layer 22. Formed between coating 27 and isolation layer 22 are a plurality of bubbles or cavities or air pockets 24 created during the manufacturing process. Although not illustrated in FIGS. 2-4, the MEMS devices 20, 30 and 40 may be disposed within an aperture 17 and electrically interconnected by wirebonds 21, wirebond pads 22, solder pads 28, similar to the MEMS transducer 25 shown in FIG. 1 in a manner that would not interfere with the application of an anti-stiction coating or isolation layer as described further herein.

In the embodiment illustrated in FIG. 2, an anti-stiction coating 27 may be applied to exterior surfaces of MEMS device 25 in an intermittent or alternating pattern. An isolation layer 22 formed of an encapsulant material having opposing water reactive properties to that of anti-stiction coating 27 causes air pockets or cavities 24 to be formed within the isolation layer during application thereof. In one embodiment, the anti-stiction coating 27 may have a hydrophobic property while the encapsulant material comprising the isolation layer 22 may have a hydrophilic property, causing the encapsulant to flow about the immediate locus of the anti-stiction coating location(s) and forming cavities thereabout, resulting in one or more air pockets whose location may be predetermined by controlling the location of the deposition or application of the anti-stiction coating prior thereto.

FIGS. 3A-B illustrate conceptually a partial cross-sectional view of a MEMS device 30 comprising a substrate 23, a MEMS transducer 25 and an anti-stiction coating 37 and an isolation layer 32. Formed between coating 37 and isolation layer 32 are a plurality of bubbles or cavities or air pockets 34 created during the manufacturing process. In the embodiment illustrated in FIG. 3A, an anti-stiction coating 37 may be applied to multiple of the exterior surfaces of MEMS device 25 as well as corners thereof. In the embodiment illustrated in FIG. 3B, an anti-stiction coating 37 may be applied to a single exterior surface of MEMS device 25. Note, depending on the closeness of the anti-stiction coating locations and the viscosity of the encapsulant one or more of the bubbles or cavities may be fluidly connected to form a continuous network of pockets or cavities around the MEMS device 25 thereby serving to further isolate the MEMS device 25 and reduce its exposure to temperature based fluctuations in performance.

FIG. 4 illustrates conceptually a partial cross-sectional view of a MEMS device 40 comprising a substrate 23, a MEMS transducer 25 and an anti-stiction coatings 47 and an isolation layer 42. Formed between coatings 47 and isolation layer 42 are a plurality of bubbles or cavities or air pockets 44 created during the manufacturing process. In the embodiment illustrated in FIG. 4, anti-stiction coating 47 may be selectively applied to only certain locations on one of the exterior surfaces of MEMS device 25 or to only certain locations of multiple exterior surfaces thereof. As with the embodiment illustrated in FIG. 2, although only one bubble or cavity is illustrated per surface, a plurality of such bubbles may form within the isolation layer 42 in the proximity of the coatings 47, the size and shape of the anti-stiction coating 47 directly affecting the size and shape of the resulting cavity 44 formed thereabout about.

In the method of manufacturing the MEMS devices 20, 30 and 40, as illustrated herein, the MEMS device 25 is first secured to substrate 23. Thereafter, an anti-stiction coating is applied to one or more locations on the exterior surface(s) of the MEMS device 25, as described herein. An anti-stitching coating suitable for use in the disclosed technique is perfluorodecyltrichlorosilane, also known as FDTS, a colorless liquid chemical whose molecules form self-assembled monolayers capable of bonding onto surfaces terminated with hydroxyl (—OH) groups, such as glass, ceramics, or $SiO_2$ forming a regular covalent bond. An FDTS monolayer may be deposited onto an exterior surface of MEMS device 25 through a process known as molecular vapor deposition (MVD) in which FDTS deposits from a vapor phase, using lower temperature deposition techniques (<150° C.), thus compatible with most substrates. Such process may be carried out in a vacuum chamber and with an assistance of a water vapor. The resulting treated surfaces have a water repellent or hydrophobic property. Note that in order to provide a series of locations on an exterior surface of MEMS device 25 the anti-stiction coating may be deposited in an intermittent or discontinuous pattern, such as a dashed line, along various surfaces, edges or corners of the MEMS device exterior, utilizing appropriate masking and vapor deposition techniques understood by those reasonably skilled in the arts. Alternatively, the anti-stiction coating may be deposited at a single location along a surface or at select locations on multiple surfaces, as illustrated in the figures. It will be understood by those reasonably skilled in the relevant parts that the anti-stiction coating may be deposited along any combination or selection of locations on the exterior surface of MEMS device 25 and that the pattern shown in the illustrative embodiments herein are not meant to be limiting.

Following the depositing of the anti-stiction coating to the exterior surfaces of the MEMS device, an isolation layer made from an encapsulant material to the exterior surfaces of MEMS device 25 in the proximity of the applied anti-stiction coating. The isolation layer described herein may be formed from one or both of injection molded compounds or elastomeric materials. In an illustrative embodiment, all or part of the encapsulating material may be formed by injection molding of a material having the opposite of hydrophilic or hydrophobic properties than that of the anti-stiction coating. Materials suitable for use in as the include injection molding compounds, such as the KE-G1250LKDS and related KE-G1250 series products, commercially available from KYOCERA Chemical Corporation, Kawaguchi City, Saitama, JAPAN; the Nitto GE-100LFCS series products, commercially available from General Electric Corporation, Fairfield, Conn.; and CEL-9220ZHF10 and related 9200 series epoxy molding compounds, commercially available from Hitachi Chemical Co., Ltd., Tokyo, Japan. Other materials suitable as the include encapsulant material include Sylgard® 160 Silicone, Sylgard® 164 Silicone, Sylgard® 170 Silicone, Sylgard® 184 Silicone, and Sylgard® 186 Silicone, all commercially available from DOW Corning Silicones, Parc Industriel de Seneffe 1, 7180 Seneffe, Belgium. Other similar or different materials may likewise be utilized to achieve the same results described herein.

In the disclosed techniques, the anti-stiction coating and the encapsulant have opposite properties relative to their reaction to water. More specifically, if the anti-stiction coating is hydrophobic, the encapsulant should be hydrophilic and vice versa. In this manner, as the encapsulant flows over the exterior surface of the MEMS device package, as it encounters the anti-stiction coating, it will flow around and above the coating without actually touching the anti-stiction coating, thereby creating a cavity or air bubble around the anti-stiction coating adjacent the exterior surface of the MEMS device. This effect is due to the viscosity of the encapsulant and fluid dynamics, particularly the venture effect, as the encapsulant flows over and about the exterior surface(s) of the MEMS device, and, further due to the opposite hydrophilic and hydrophobic properties of the anti-stiction coating and encapsulant material, that is the tendency of nonpolar substances to aggregate in aqueous solution and exclude water molecules. Accordingly, in the disclosed embodiments, if the anti-stiction coating is hydrophobic by nature, the encapsulant material comprising the isolation layer should be hydrophilic. Conversely, if the anti-stiction coating is hydrophilic by nature, the encapsulant material comprising the isolation layer should be hydrophobic.

The water resistive nature of the encapsulant material may be determined by the the percentage of filler material within the encapsulant compound. For example, for the encapsulant compound to be hydrophilic in character, the filler material should comprise approximately 50% or greater by molecular weight of the encapsulant compound. Similarly, for the encapsulant compound to be hydrophobic in character, the filler material should comprise approximately less than 50% by molecular weight of the encapsulant compound.

FIG. 5 illustrates conceptually a partial enlarged view, not to scale, of a bubble or cavity formed intermediate the isolation layer 52 and an exterior surface of MEMS device 55 in accordance with the disclosure. In FIG. 5, MEMS device 50 comprises a MEMS transducer 55 and an anti-stiction coatings 57 and an isolation layer 52. Formed between coatings 57 and isolation layer 52 is a cavity or air pocket 54 created during the manufacturing process. Note that in the disclosed technique, the air pockets or cavities are partially defined by the exterior surface of the MEMS transducer containing the anti-stiction coating. Utilizing the disclosed technique, the ability to define the specific location and shape of air pocket(s) immediately adjacent the exterior surface of the MEMS transducer provides greater control over thermal and vibratory isolation than isolation mediums having substantially uniform shaped air bubbles evenly dispersed throughout the isolation medium. As such, the disclosed method creates a cocoon of air around immediately adjacent sensitive areas of the MEMS device 25 preventing and reducing exposure to heat fluctuations and thus providing extra operational stability across the temperature range.

It will be obvious to those recently skilled in the art that modifications to the apparatus and process disclosed here in may occur, including substitution of various component values or nodes of connection, without parting from the true spirit and scope of the disclosure.

What is claimed is:

1. A microelectromechanical (MEMS) apparatus comprising:

a MEMS transducer having plurality of exterior surfaces; and an isolation layer at least partially surrounding at least one of the plurality of exterior surfaces and encompassing a plurality of cavities formed within the isolation layer and adjacent the one of the plurality of exterior surfaces.

2. The MEMS apparatus of claim 1 wherein each of the plurality of cavities formed within the isolation layer is proximate a section of anti-stiction coating disposed on the one of the plurality of exterior surfaces.

3. The MEMS apparatus of claim 1 wherein one of the anti-stiction coating and the isolation layer is hydrophobic and the other of the anti-stiction coating and isolation layer is hydrophilic.

4. A microelectromechanical (MEMS) apparatus comprising:
   a MEMS transducer having an exterior surface; and
   an isolation layer surrounding the exterior surface and encompassing a plurality of cavities formed within the isolation layer, the plurality of cavities adjacent the exterior surface.

5. The MEMS apparatus of claim 4 further comprising:
   an anti-stiction coating disposed on the exterior surface.

6. The MEMS apparatus of claim 4 wherein one of the anti-stiction coating and the isolation layer is hydrophobic and the other of the anti-stiction coating and isolation layer is hydrophilic.

7. A microelectromechanical (MEMS) apparatus comprising:
   a MEMS transducer having plurality of exterior surfaces;
   an anti-stiction coating disposed on at least a portion of one of the plurality of exterior surfaces; and
   a plurality of cavities formed within an isolation-layer surrounding the one of the plurality of exterior surfaces;
   wherein one of the anti-stiction coating and the isolation layer is hydrophobic and the other of the anti-stiction coating and isolation layer is hydrophilic.

8. The MEMS apparatus of claim 7, further comprising a plurality of anti-stiction coatings disposed on a plurality of portions of said one of the plurality of exterior surfaces.

9. The MEMS apparatus of claim 8, wherein each of the plurality of cavities surrounds one of the plurality of anti-stiction coatings.

10. The MEMS apparatus of claim 7 further comprising a plurality of anti-stiction coatings disposed on multiple of the plurality of exterior surfaces.

11. The MEMS apparatus of claim 7 wherein the isolation layer is hydrophilic.

12. The MEMS apparatus of claim 7 wherein the anti-stiction coating is hydrophobic.

* * * * *

UNITED STATES PATENT AND TRADEMARK OFFICE
CERTIFICATE OF CORRECTION

PATENT NO.        : 9,284,182 B1
APPLICATION NO.   : 13/971088
DATED             : March 15, 2016
INVENTOR(S)       : Ashish A. Shah It is certified that error appears in the above-identified patent and that said Letters Patent is hereby corrected as shown below:

In the Claims

In column 10, line 4 (claim 7), "a plurality of cavities formed within an isolation-layer;" should read -- a plurality of cavities formed within an isolation layer --

Signed and Sealed this
Seventeenth Day of May, 2016

Michelle K. Lee
*Director of the United States Patent and Trademark Office*